United States Patent [19]

Balkanski

[11] Patent Number: 4,878,094
[45] Date of Patent: Oct. 31, 1989

[54] SELF-POWERED ELECTRONIC COMPONENT AND MANUFACTURING METHOD THEREFOR

[76] Inventor: Minko Balkanski, 2 Avenue Camoens, 75016 Paris, France

[21] Appl. No.: 175,311

[22] Filed: Mar. 30, 1988

[51] Int. Cl.⁴ ............................................. H01L 39/22
[52] U.S. Cl. ......................................... 357/5; 307/306; 505/832; 505/817
[58] Field of Search .................... 505/832, 817; 357/5; 307/306

[56] References Cited

U.S. PATENT DOCUMENTS

| | | | |
|---|---|---|---|
| 4,316,200 | 2/1982 | Ames | 357/5 |
| 4,423,430 | 12/1983 | Hasuo | 357/5 |
| 4,430,662 | 2/1984 | Jillie, Jr. | 357/5 |

Primary Examiner—Martin H. Edlow
Attorney, Agent, or Firm—Lowe, Price, LeBlanc, Becker & Shur

[57] ABSTRACT

A self-powered electronic component, particularly, a Josephson junction, is formed of a layer of a superconductor epitaxially grown on a substrate formed of a single crystal of silicon. In accordance with one embodiment of the invention, the expitaxial superconductor layer is separated into two parts by a groove defined by a thin growth region, forming the Josephson junction. On the epitaxial layer at the first side of the junction is deposited a thin layer of an insertion material forming the positive pole of the Josephson junction as well as the cathode of a solid state power generator. On the epitaxial layer and over the thin layer of insertion material is deposited a separator, or fast ion conductor, which assumes the weak link of the Josephson junction as well as separates the ion source from the electronic exchanger and assumes the fast ion transport. A thin film of material, such as Lithium, providing an ion source and forming the anode of the junction, is deposited over the Josephson junction, covering the separator and extending into contact with the opposite side of the junction.

5 Claims, 4 Drawing Sheets

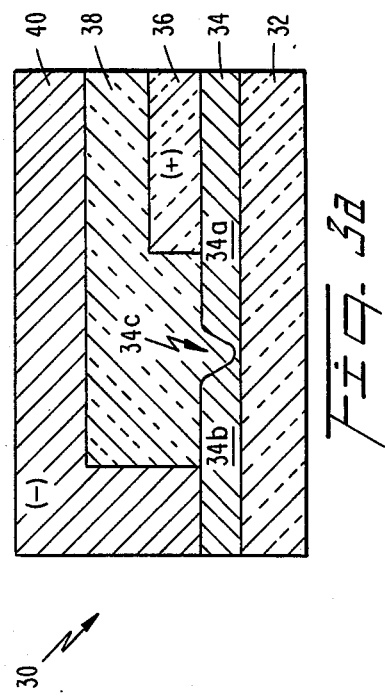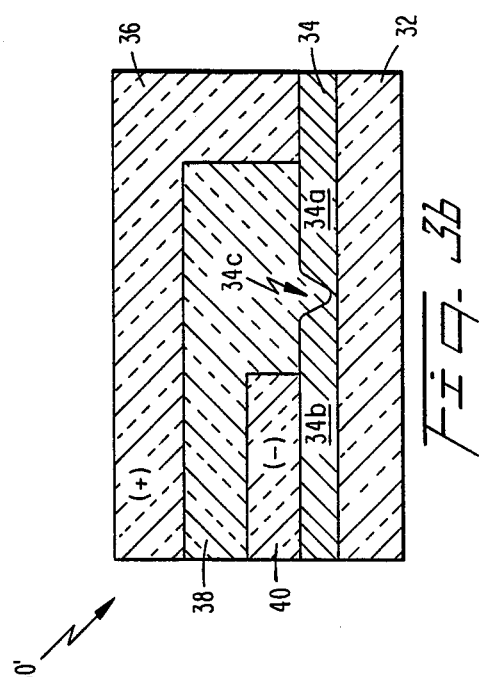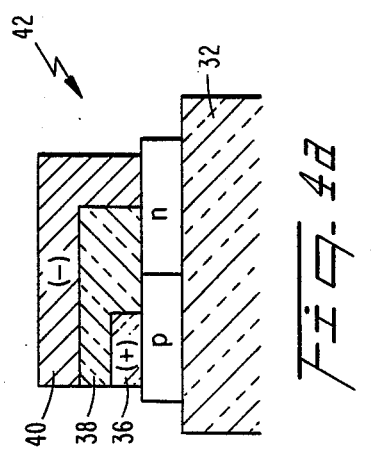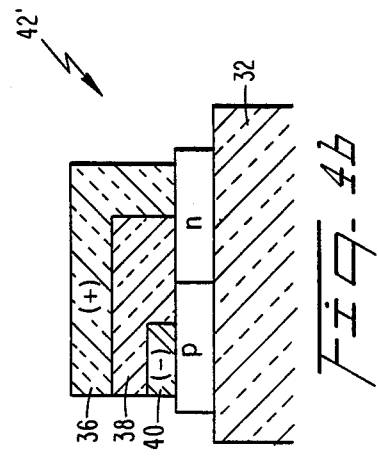

SELF-POWERED ELECTRONIC COMPONENT AND MANUFACTURING METHOD THEREFOR

TECHNICAL FIELD

The invention relates generally to electronic components, and more particularly, to electronic components that are self-powered, and to a manufacturing method therefor.

BACKGROUND ART

The component density of electronic circuits that may be incorporated onto a common substrate has increased substantially with the advent of so-called "Very Large Scale Integrated Circuits", or "VLSI", wherein integrated circuit fabrication techniques are implemented to produce solid state memories of one megabit and more. The component density of VLSI circuits is limited by, among other things, (1) the limited resolution of components and interconnections using present photolithographic techniques, (2) the requirement of power leads distributed throughout the integrated circuit to carry bias voltage to the components therein and, accordingly, (3) the difficulty of fabricating integrated circuits as threedimensional structures. The invention described herein is directed principally toward (2).

The biasing source of existing electronic systems is external. The system is interconnected with the external source by a set of conducting leads distributed in an appropriate way to reach each one of the components of the system. When any component is situated deep into the bulk of the system, very far from its periphery, the complexity of the connection of the electrical system increases substantially with a concomitant reduction of bias voltage distribution efficiency. Also, the leads necessary to reach each one of the components of a VLSI system constitute a network whose complexity, volume and weight limit integration density and operating efficiency, e.g., switching speed.

In order to increase the integration density, as well as to reduce the volume and weight, of such circuits, it is desirable to eliminate all leads for power delivery into the circuits, and to create a new architecture incorporating components that do not rely on external power, but rather are self-powered.

Accordingly, one object of the invention is to provide unique self-powered electronic components, and a manufacturing method therefor.

Another object of the invention is to increase the integration density of very large scale integrated circuits by providing self-powered circuit components therein.

A further object is to combine multi-layer circuit component structures and a solid-state battery structure to form self-powered electronic components.

A still further object is to integrate the function of an electronic component, such as a Josephson junction diode or transistor, with an internal power source for delivering to the component its biasing voltage.

DISCLOSURE OF INVENTION

The forgoing and other objects are satisfied, in accordance with the invention, by incorporating into an electronic component within an integrated circuit system, a solid state electrical power generator of a type described in my U.S. applications Ser. No. 859,819, filed on May 5, 1986 and Ser. No. 117,869, filed on Nov. 9, 1987, to provide a locally self-powered electronic component to be used within an integrated circuit. In accordance with one preferred embodiment of the invention, a layer of a superconductor is epitaxially grown on a substrate formed of a single crystal of silicon. The expitaxial superconductor layer is separated into two parts by a groove defined by a thin growth region, forming a Josephson junction. On the epitaxial layer at the first side of the junction is deposited a thin layer of an insertion material forming the positive pole of the Josephson junction as well as the cathode of a solid state power generator of a type shown in my U.S. applications. On the epitaxial layer and over the thin layer of insertion material is deposited a separator, or fast ion conductor, which assumes the weak link of the Josephson junction as well as separates the ion source from the electronic exchanger and assumes the fast ion transport. A thin film of material, such as Lithium, providing an ion source and forming the anode of the junction with microbattery or power source, is deposited over the Josephson junction, covering the separator and extending into contact with the opposite side of the junction.

Alternatively, the order of depositions stacked on the insertion material can be reversed, i.e., the thin layer of Lithium is deposited on the epitaxial superconductor at one side of the junction, followed by the isolator which extends over the Josephson junction and then the exchanger, covering the separator and extending into contact with the other side of the junction.

Ion transport from the anode to the cathode of the solid state battery establishes a source of voltage which self-biases the junction. This means of self-powering electronic systems is applicable to different circuit functions, such as modulation, amplification, memory and to the components thereof.

Still other objects and advantages of the present invention will become readily apparent to those skilled in this art from the following detailed description, wherein only the preferred embodiment of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 3(a) is a cross-sectional view of one embodiment of a self-powered Josephson junction in accordance with the invention, and FIG. 3(b) shows a modification thereof;

FIG. 4(a) is a cross-sectional view of a self-powered diode in accordance with the invention, and FIG. 4(b) shows a modification thereof;

BEST MODE FOR PRACTICING THE INVENTION

Figure 1:
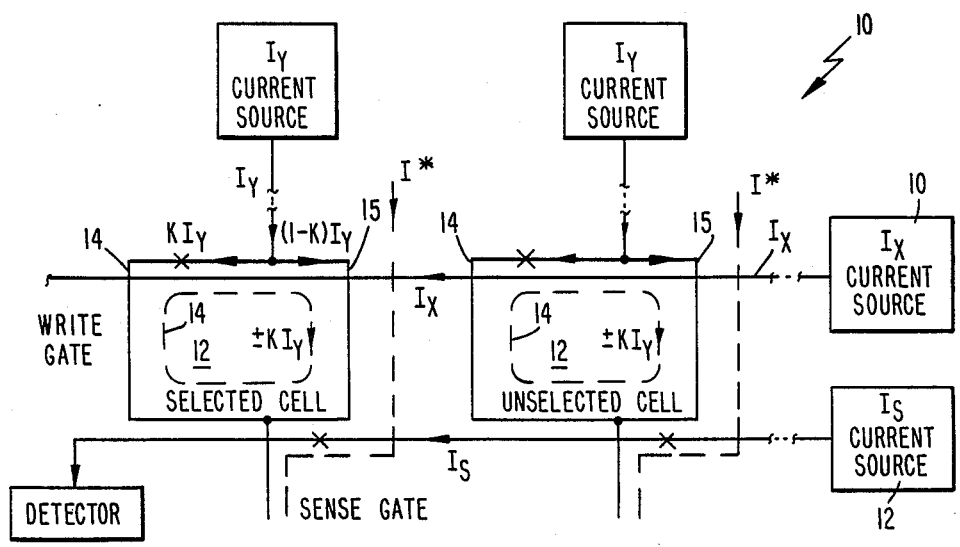
FIG. 1 is a circuit diagram showing a memory formed of Josephson junction diodes of a type that are self-powered in accordance with the invention.

Referring to FIG. 1, a portion of an array 10 of Josephson memory cells 12 utilize equal counterrotating circulating currents $+/-kI_y$ in a superconductive loop to represent a binary "1" and "0". The structure and operation of these cells are described in detail in U.S. Pat. No. 4,130,893, incorporated herein by reference in its entirety. In general, the array 10 utilizes counterrotating circulating currents in a superconductive loop to represent the binary "1"s and "0"s. Each superconducting loop has a pair of branches 14, 15 which have given values of inductance. In addition, a write gate consisting of a Josephson junction is disposed in one of the branches 14 while a sense gate is disposed in electromagnetically coupled relationship with the other branch 15 of the superconductive loop. Current sources for applying coincident currents to both the write and sense gates are also shown at 18. An additional control line 19 associated with the sense gate is shown in dashed line form, indicating that an additional control current may be applied to an associated sense gate.

Accordingly, it is apparent that a relatively large number of signal flow paths, each requiring an electrical lead, are required to carry the various signals that are processed within the array. Furthermore, bearing in mind that each cell comprises at least one semiconductor or superconductor component, in this example, a Josephson junction device, additional leads which carry bias and reference voltages to the cell must be incorporated on the substrate common to the array. The number of leads involved, in total, accordingly becomes large so that integration density of the circuitry is limited and fabrication of three-dimensional integrated circuits is virtually impossible to carry out.

Figure 2:
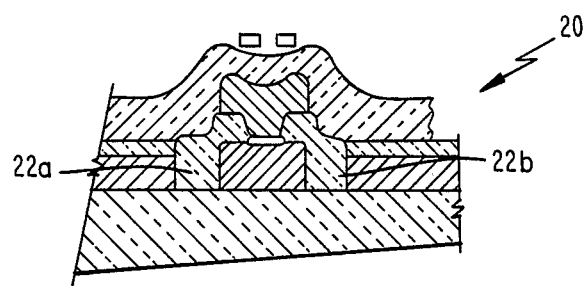
FIG. 2 is a cross-sectional view of a prior art form of a Josephson junction.

The structure of a known Josephson junction 20, shown in FIG. 2, comprises a thin film of high temperature superconducting material 22, such as YBaCuO or BiCaS$_2$CuO, cut into two parts 22a and 22b by a selective growth. The depth and width of the growth establish, selectively, weak coupling or strong coupling; particular applications of the Josephson junction depend upon the degree of coupling. For more details on the structure and operation of the Josephson junction, see, for example, U.S. Pat. No. 4,509,146, incorporated herein by reference. In accordance with my U.S. applications, supra, also incorporated herein by reference in their entireties, a solid state battery is formed by two metallic contact elements between which are superimposed, successively, a thin layer of an alkali metal which provides a source of ions, a thin layer of ion-superconducting solid electrolyte glass of high ionic conductivity, and a layered intercalation compound capable of inserting ions issued from the thin layer of alkali metal. The lamellae of the layered compound are oriented substantially perpendicularly to the surface of the solid electrolyte.

The invention now described with reference to the following discussion incorporates a solid state battery structure of the type provided in my said U.S. applications into an electronic component so that the component becomes locally self-powered. For purpose of illustration of the principles of the invention, the preferred embodiment described is a self-powered Josephson junction; however, it should be understood that other components or systems, such as modulators, amplifiers, memories, etc., can be self-powered as well, using the principles taught herein.

Thus, with reference to FIG. 3, a self-powered Josephson junction 30 comprises a substrate 32 is formed of a single crystal of, for example, {100} S$_2$TiO$_3$ or {100} Si or {102} sapphire or {100} yttria stabilized cubic ZrO$_2$. The surface of the substrate 32 has deposited thereon, by molecular beam epitaxy, a layer of a high temperature superconductor 34, separated into two regions 34(a) and 34(b) by a very thin growth at 34(c) to form a Josephson junction in the usual manner.

On the epitaxial layer 34 at the first side 34(a) of the junction is deposited a thin layer 36 of an insertion material forming the positive pole of the Josephson junction as well as forming the cathode of a solid state power generator of a type shown in my U.S. applications, supra. The insertion material is of the group:

MX or M$_2$X$_3$, wherein M=In, Bi, and S=S, Se, Te or

MPX$_3$, wherein M=Fe, Ni, Co and X=S, Se, Te or

MX$_2$, wherein M=Ti, Hf, Zr, Mo and X=S, Se, Te or

T$_2$O$_5$ or

V$_2$O$_5$ or

V$_6$O$_{13}$.

On the epitaxial layer is also deposited a separator 38, or fast ion conductor, which assumes the weak link of the Josephson junction as well as separates the ion source from the electronic exchanger and assumes the fast ion transport. The separator 38 is a fast ion conducting material as well as a good electronic insulator, and can be either a crystalline superionic conductor or a fast ion conducting glass, such as B$_2$O$_3$ - Li$_2$O - LiX or B$_2$S$_3$ - Li$_2$S - LiX, wherein X=Cl, Br, I and B$_2$O$_3$ - Li$_2$O - Li$_2$SO$_4$, B$_2$S$_3$ - LiS - LiSO$_4$.

A thin layer 40 of material, such as Lithium, or, alternatively, Na, K, Ag or Cu serving as an ion source and forming the anode of the solid state battery is deposited covering the separator 38 and extending into contact with the opposite side 34b of the junction.

The anode 40 (Li) serves as an ion source to supply ions Li$^+$ which diffuse through the separator, fast ion conductor 38 and reach the electron exchanger 36, the intercalation compound. Insertion of Li into the insertion compound, mixed ion and electronic conductor 36 creates an electromotive force V and establishes a potential difference V thus powering the Josephson junction. The microbattery Li/B$_2$O$_2$-Li$_2$SO$_4$/InSe is an electric power generator delivering a voltage of 1.8 volts and a current density of ten microamperes per square centimeter, more than necessary to power a Josephson junction.

Alternatively, a self-powered component can be provided by the structure 30' of FIG. 3(b) wherein the order of successive layers on substrate 32 is reversed, i.e., the thin layer of Lithium 40 is deposited on the epitaxial superconductor 34 at one side 34b of the junction, and then the separator 38 is deposited on the Lithium. Finally, the exchanger is deposited over the Josephson junction, covering the separator and extending into contact with the other side 34a of the junction.

Other self-powered electronic components can similarly be provided using the principles taught hereinabove. For example, a diode 42 in FIG. 4(a) has a p-n junction shown therein powered by a microbattery formed of the layers 36–40 in the same manner as described with respect to the Josephson junction described earlier; the microbattery layers are reversed in order within the self-powered diode 42′ of FIG. 4(b).

Figure 5B:
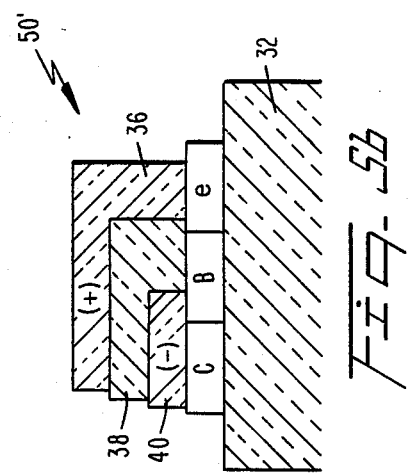
FIG. 5(a) is a cross-sectional view of a self-powered transistor in accordance with the invention, and FIG. 5(b) show a modification thereof.
Figure 5A:
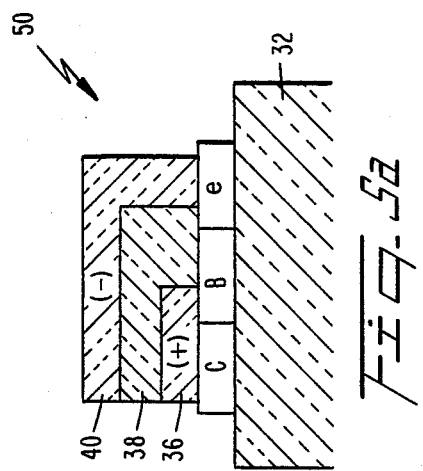

As another example, the transistor 50 shown schematically in FIG. 5(a) is self-powered by a microbattery having the same layers 36–40; the microbattery layers are reversed in order in FIG. 5(b).

Figure 6:
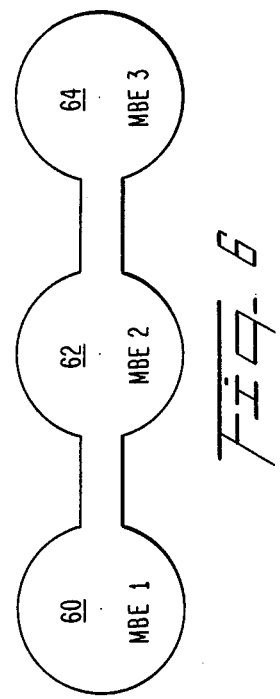
FIG. 6 shows, symbolically, an apparatus for manufacturing a self-powered component in accordance with the invention.
Figure 7:
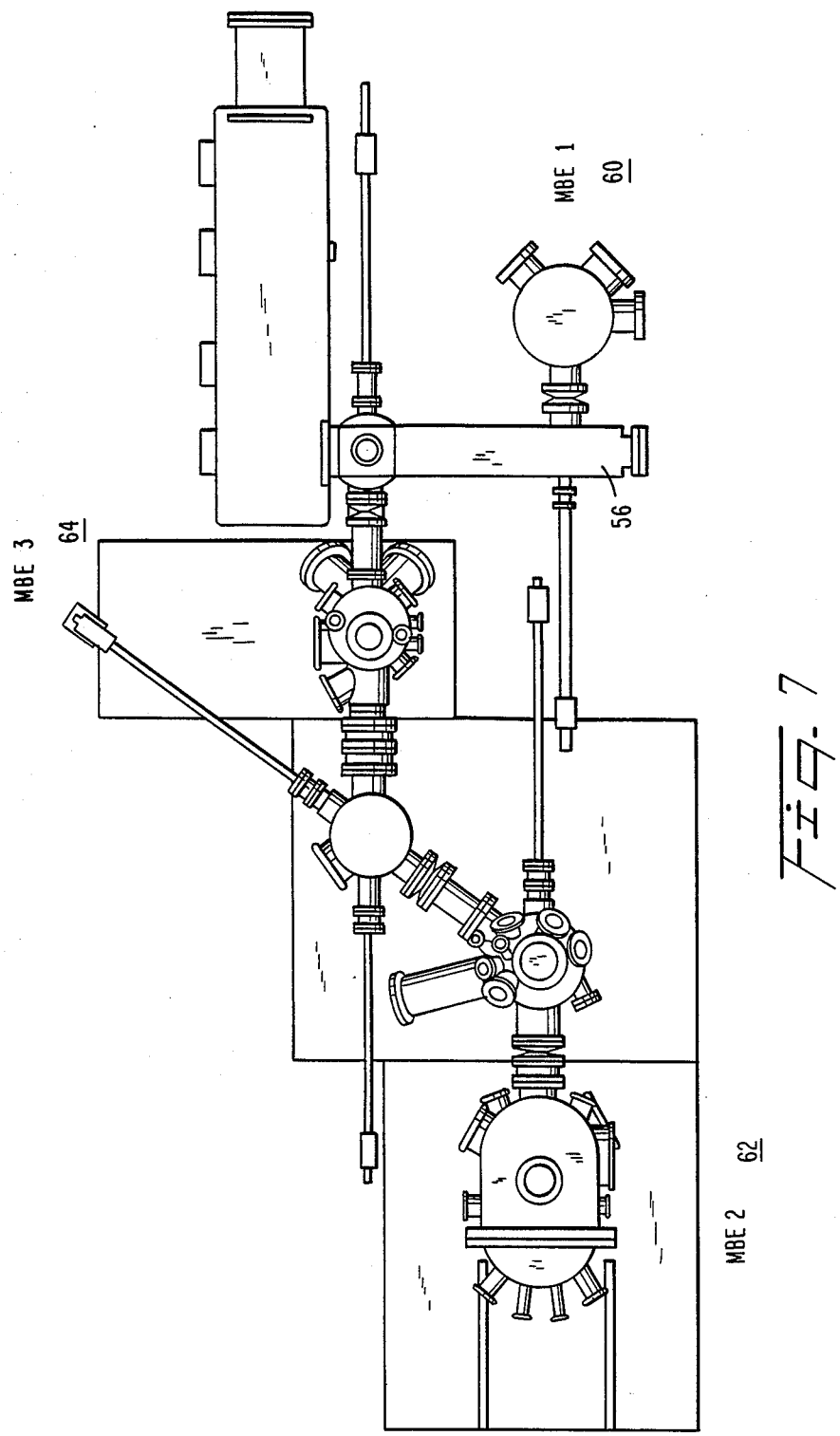
FIG. 7 is a more detailed diagram of the apparatus of FIG. 6.

A self-powered component in accordance with the invention is manufactured using the apparatus shown symbolically in FIG. 6 and in more detail in FIG. 7. With reference to these figures, a single crystal oriented substrate is introduced into the apparatus through the high vacuum introduction chamber 56 and then transferred into the MBE chamber 60 for evaporation formation of the superconducting material YBaCuO or BiCaS2CuO. A thin film, of the order of one micron or less of superconductor, is here deposited by MBE on the substrate. The method of formation within chamber 60 comprises first evaporation of the elements Y, Ba, Cu or Bi, Cu, $S_2$, Cu, then oxidizing the layer by controlled oxygen input. The MBE chamber 60 is equipped not only with high temperature furnaces for the heating and evaporation of the elements but also with an electron gun as well as with an ion gun and laser source for reaching evaporation temperatures up to 2000 degrees C. The ion and electron guns and laser can also be used to trace the growth which separates the superconductor thin film into two parts 34a and 34b of the junction.

The substrate and the thin layer of superconductor, cut into two parts to form the Josephson junction, is now transferred into the vacuum chamber 64 in which a thin film of alkali metal (Li, Na, K or Ag, or Cu) is deposited on the part 34b of the junction to form the anode, ion source for the generator.

Above the metallic thin film forming the anode is deposited a thin film of fast ion conductor, borate glass $B_2S - Li_2S - LiI$ to cover the growth separating parts 34a,b of the junction forming the insulator, coupling material and to extend over a part of the side 34a of the junction. After this operation is completed, the substrate on which these successive layers have been deposited is now transferred into the ultra high vacuum chamber 62 in which the layered, intercalation, compound is deposited by MBE, in adequately adjusting the substrate temperature and the temperatures of the evaporating cell of the elements so as to adjust the partial pressure of the evaporated elements in order to form the desired stoichiometric compounds.

An alternative procedure is to evaporate first the superconductor in chamber 60, then to transfer the device to chamber 62 and evaporate the cathode material, layered intercalation compound, and after this, to transfer the device to chamber 64 to evaporate the separator fast ion conducting glass and finally to evaporate the anode material (Li).

Another alternative procedure is to start in chamber 60 with the evaporation of a semiconductor forming two differently doped regions of n and p impurities to constitute a p-n junction diode, for forming three differently doped regions constituting drain, source and gate regions of a transistor. The procedure is similar as that for formation of the Josephson junction.

The three interconnected vacuum chambers 60, 62 and 64 are maintained preferably below $10^{-10}$ torr. Each of the chambers 60–64, shown in FIG. 7, is a molecular beam epitaxy (MBE) system equipped with a quadrapole mass spectrometer (QUAD) for the control of the composition and with reflexion high energy electron diffraction (RHEED) for the control of the structure.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

What is claimed is:
1. A self-powered semiconductor component, comprising:
   a semiconductor substrate;
   layers of semiconductor materials having different electrical conductivities and together forming an electronic component; and
   a microbattery integrated with said component, said microbattery comprising
   (a) a layer of an alkali metal which provides a source of ions and forms the negative electrode of the microbattery;
   (b) a layer of an intercalation compound capable of inserting ions issued from the alkali metal and forming the positive electrode of the battery; and
   (c) a layer of an ion-superconducting solid electrolyte glass of high ionic conductivity forming a separator between said alkali metal and intercalation compound layers.
2. The component of claim 1, wherein said layers of semiconductor material comprise p- and n-doped semiconductor materials together forming the poles of a diode.
3. The component of claim 1, wherein said layers of semiconductor material comprise p- and n-doped semiconductor materials together forming the emitter, base and collector regions of a transistor.
4. A self-powered Josephson junction device, comprising:
   a substrate formed of a single crystal of silicon;
   a layer of a superconductor epitaxially grown on the substrate, said superconductor layer being separated into two parts by a groove formed by a thin growth region and forming a Josephson junction;
   a layer of an insertion material forming the positive pole of the Josephson junction as well as the cathode of a microbattery deposited on the epitaxial layer at one side of the junction;
   a separator layer deposited on the epitaxial layer and over the thin layer of insertion material, said separator layer assuming the weak link of the Josephson junction; and
   a layer of an alkali metal providing an ion source and forming the anode of the microbattery deposited over the Josephson junction, covering the separator and extending into contact with the opposite side of said junction.
5. A self-powered Josephson junction device, comprising:
   a substrate formed of a single crystal of silicon;
   a layer of a superconductor epitaxially grown on the substrate, said superconductor layer being separated into two parts by a groove formed by a thin growth region and forming a Josephson junction;
   a layer of an alkali metal providing an ion source and forming the anode of the microbattery deposited on the epitaxial layer on one side of said junction;
   a separator layer deposited on the epitaxial layer and over the layer of alkali metal, said separator layer assuming the weak link of the Josephson junction; and a layer of an insertion material forming the positive pole of the Josephson junction as well as the cathode of a microbattery deposited on the epitaxial layer over the Josephson junction, covering the sseparator and extending into contact with the opposite side of said junction.

* * * * *